United States Patent

Isberg et al.

[11] Patent Number: 6,029,052
[45] Date of Patent: Feb. 22, 2000

[54] MULTIPLE-MODE DIRECT CONVERSION RECEIVER

[75] Inventors: Martin Isberg, Lund; Bjorn Lindquist, Bjärred; Peter Jakobsson, Lund; Jan Celander, Lund; Kjell Gustafsson, Lund; Lars-Peter Künkel, Lund; Torsten Carlsson, Lund; Jacob Mannerstråle, Färlöv, all of Sweden

[73] Assignee: Telefonaktiebolaget LM Ericsson, Stockholm, Sweden

[21] Appl. No.: 08/886,244

[22] Filed: Jul. 1, 1997

[51] Int. Cl.[7] .................................................. H04Q 7/32
[52] U.S. Cl. .......................... 455/131; 455/323; 455/311; 455/339; 455/150.1; 455/180.1; 455/188.1; 455/189.1; 455/190.1; 455/255
[58] Field of Search ...................... 455/323, 313, 455/311, 339, 131, 150.1, 280, 180.1, 188.1, 189.1, 190.1, 191.1, 255, 256, 258, 101, 86; 375/316, 324, 350, 334

[56] References Cited

U.S. PATENT DOCUMENTS

| | | | |
|---|---|---|---|
| 3,940,697 | 2/1976 | Morgan | 455/131 |
| 4,352,203 | 9/1982 | Ohkubo | 344/176 |
| 4,598,422 | 7/1986 | Fellman | 455/180 |
| 4,672,640 | 6/1987 | Meek et al. | 455/323 |
| 4,881,272 | 11/1989 | Eguchi | 455/143 |
| 4,939,789 | 7/1990 | Sakashita et al. | 455/260 |
| 4,972,509 | 11/1990 | Maejima | 455/180 |
| 4,978,944 | 12/1990 | Andros et al. | 455/131 |
| 5,003,621 | 3/1991 | Gailus | 455/324 |
| 5,027,430 | 6/1991 | Yamauchi et al. | 455/188 |
| 5,091,921 | 2/1992 | Minami | 375/334 |
| 5,280,636 | 1/1994 | Kelley et al. | 455/131 |
| 5,557,642 | 9/1996 | Williams | 455/323 |
| 5,564,076 | 10/1996 | Auvray | 455/76 |
| 5,579,347 | 11/1996 | Lindquist et al. | 375/346 |
| 5,926,751 | 7/1999 | Vlahos et al. | 455/150.1 |

FOREIGN PATENT DOCUMENTS

| | | | |
|---|---|---|---|
| 0 180 339 | 5/1986 | European Pat. Off. | H03D 5/00 |
| 0 660 626 | 6/1995 | European Pat. Off. | H04Q 7/32 |
| 0 678 974 | 10/1995 | European Pat. Off. | H03D 7/16 |
| 0 682 458 | 11/1995 | European Pat. Off. | H04Q 7/32 |
| 0 780 993 | 6/1997 | European Pat. Off. | H04B 1/40 |

OTHER PUBLICATIONS

RT1–D Receiver Technology, 2.3 Homodyne receiver, pp. 8–9.

"Design of an Integrated Front–End for a Direct Conversion Receiver," Martin Isberg, Depart of Applied Electronics, Lund Institute of Technology, 1994, p. 62.

*Primary Examiner*—Wellington Chin
*Assistant Examiner*—Keith Ferguson
*Attorney, Agent, or Firm*—Burns, Doane, Swecker & Mathis, L.L.P.

[57] ABSTRACT

A multiple-mode receiver incorporating direct conversion (processing received signals using intermediate frequencies within the same frequency range as the received signal bandwidth) rather than superheterodyne circuitry, allowing receiver hardware components to be re-used rather than replicated for each band. Various embodiments are disclosed in which low pass filters, mixers, quadrature generators, oscillators, and amplifiers are re-used.

18 Claims, 5 Drawing Sheets

MULTIPLE-MODE DIRECT CONVERSION RECEIVER

FIELD OF THE INVENTION

The present invention relates generally to multiple-band wireless communication devices and systems. More particularly, the present invention relates to multiple-band wireless communication devices and systems incorporating direct conversion rather than superheterodyne circuitry.

BACKGROUND OF THE INVENTION

As the field of wireless communications continues to develop at a rapid pace, the increasing number of systems and frequency bands in use conflicts with the consumer demand for increased mobility. That is, a problem results when different consumers subscribe to wireless communication systems using different technical standards. To avoid this problem, global standardized systems have been proposed in which the same frequency band is in use by all wireless communication systems. However, this solution is impractical because wireless communication systems are operators desire to maximize the return on their investment in the many different systems which already exist or which are already under development. Further, history suggests that it would be extremely difficult for all manufacturers to agree on a single standardized system.

An alternative solution to the problem of maximizing mobility where multiple wireless communication systems exist is to incorporate dual- or multi-mode capabilities in a wireless communication device to enable a subscriber to communicate on different wireless communication systems. This solution is particularly desirable where the different wireless communication systems operate at different carrier frequencies or frequency bands, but use the same modulation scheme and same baseband processing scheme. The well-known Global System for Mobile communications (GSM), Personal Communication Services (PCS), and Digital Communication System (DCS) systems share such similarities.

However, almost all known wireless communication devices are of the single-band type, because it is difficult to incorporate multi-band capabilities into a wireless communication device, given the size and cost limitations of typical devices. Further, most wireless communication devices use receivers which incorporate superheterodyne circuitry, in which received signals at a first frequency are converted to one or more second, intermediate frequencies for processing by the receiver. The intermediate frequencies can differ substantially from the first frequency. An exemplary known superheterodyne receiver is shown in FIG. 1, in which signals are received at an antenna 10, filtered in a band-pass filter 12, amplified in an amplifier 14, and converted to a first intermediate frequency by local oscillator LO1 and mixer 16. The signal at the first intermediate frequency is then processed by band pass filter 18 and amplifier 20, and converted to a second intermediate frequency by local oscillator LO2 and mixer 22. This second intermediate frequency signal is filtered in band pass filter 24 and is processed by further circuitry (not shown). Because a superheterodyne receiver processes signals at multiple frequencies, it is difficult to provide multi-mode capabilities without duplicating many receiver hardware components.

Accordingly, it would be desirable for a wireless communication device to be able to receive signals at multiple frequency bands while minimizing the duplication of receiver hardware.

SUMMARY OF THE INVENTION

The present invention overcomes the above-described problems, and provides additional advantages, by providing for a wireless communication device which can receive signals at multiple frequency bands without requiring significant hardware duplication. To achieve this result, the wireless communication device according to the present invention uses direct conversion, wherein the use of intermediate frequencies is either eliminated or any frequency conversion is limited to frequencies within the bandwidth of the received signals.

According to a first embodiment of the present invention, a multiple-band communication receiver includes an antenna or other receiving means for receiving communication signals on one of a plurality of frequency bands; one or more band pass filters for filtering communication signals in each of the plurality of frequency bands; amplifiers for selectively amplifying filtered communication signals in one of the plurality of bands; one or more quadrature generators for generating in-phase and quadrature signals from the amplified signals; low pass filters for filtering the in-phase and quadrature signals; and baseband processing circuitry for processing the low-pass filtered in-phase and quadrature signals. The quadrature signals are within the frequency range of the received signals.

In accordance with the invention, certain portions of the receiver circuitry are re-used to simplify the circuit. Thus, further embodiments of the invention are disclosed in which low-noise amplifiers are divided into frequency-specific amplifier portions and generic amplifier portions and in which mixers, quadrature generators, and/or voltage-controlled oscillators are re-used. Because direct conversion principles are employed, low pass filters can be used to filter the quadrature signals in place of the band pass filters required in a typical superheterodyne receiver. Since low pass filters are more easily implemented than band pass filters, the receiver circuit can be farther simplified.

BRIEF DESCRIPTION OF THE DRAWINGS

A more complete understanding of the present invention can be obtained upon reading the following Detailed Description of the Preferred Embodiments, in conjunction with the accompanying drawings, in which like reference indicia are used to designate like elements, and in which.

DETAILED DESCRIPTION OF THE PREFERRED EMBODIMENTS

Figure 1:
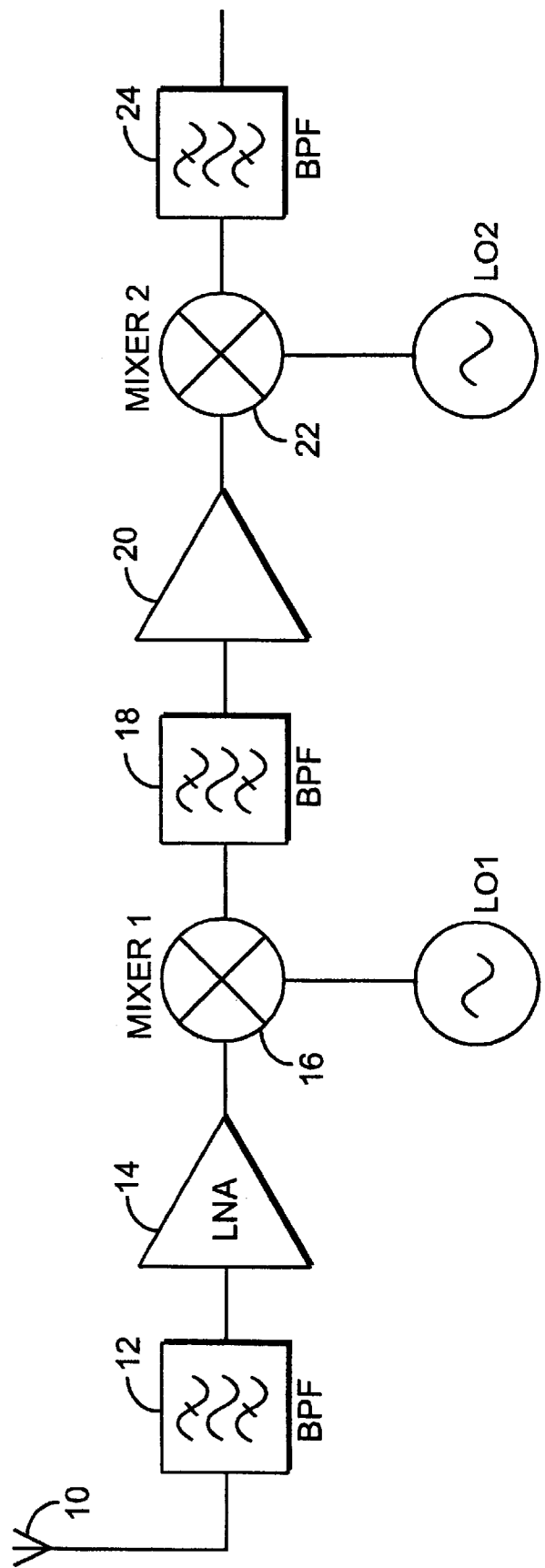
FIG. 1 is a block diagram of a conventional superheterodyne receiver.
Figure 2:
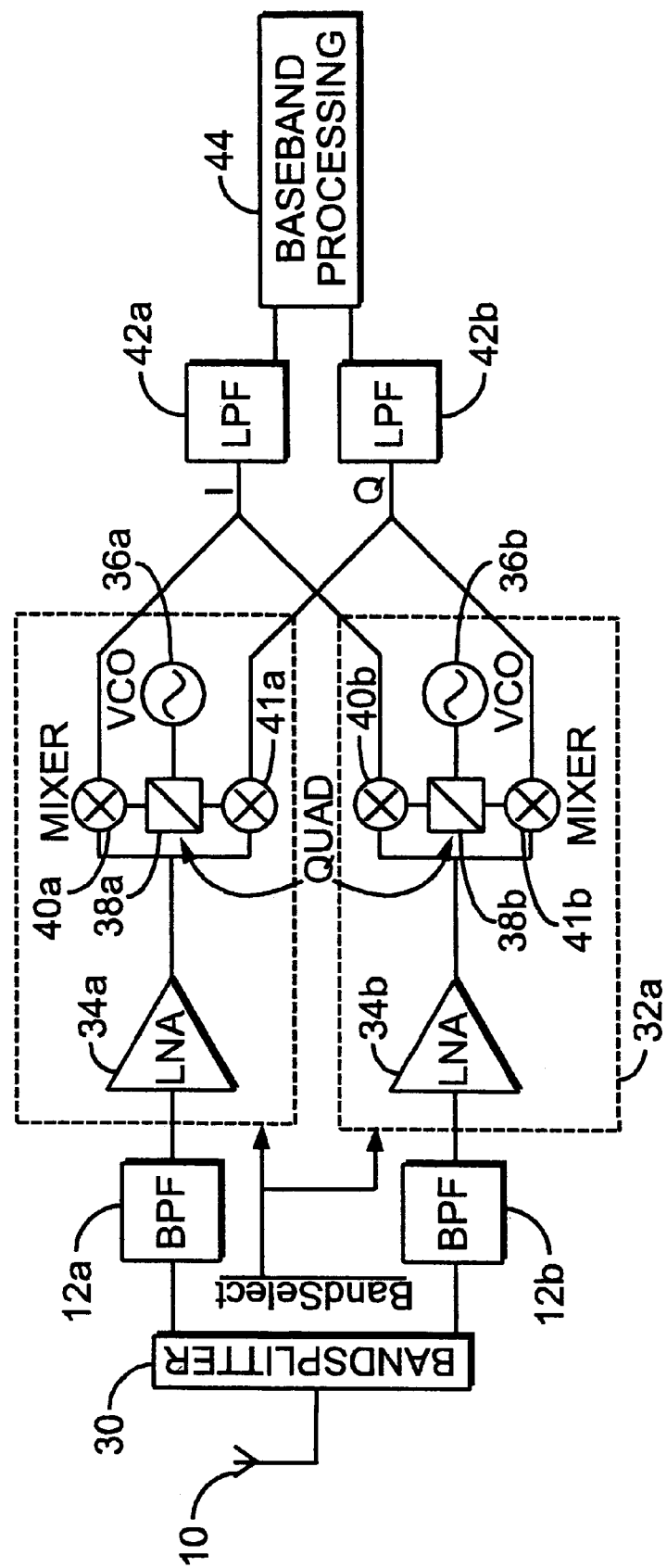
FIG. 2 is a block diagram of a direct-conversion receiver according to a first preferred embodiment of the present invention.

FIG. 2 shows a block diagram of a direct conversion receiver according to a first preferred embodiment of the present invention. The receiver includes an antenna 10 for receiving signals and a bandsplitter 30 for splitting the received signals into first and second bands. First and second band pass filters 12a and 12b filter the split signals in the first and second bands, respectively. These band pass filters are frequency (band) specific, and can be omitted if the receiver linearity is relatively high. Alternatively, bandsplitter 30 can be omitted if band pass filters are used. In most cases, band pass filters are desirable to minimize power consumption. As another alternative, a single multiband filter having one input and multiple outputs (one output per band) could replace the bandsplitter 30 and band pass filters 12a and 12b. The filtered signals output by filters 12a and 12b are supplied to processing units 32a and 32b, respectively, which convert the bandpass-filtered signals into baseband signals for further processing. Processing units 32a and 32b generate in-phase and quadrature components of the signals in the first frequency band or second frequency band, depending upon which band is selected. Band selection can be performed by the subscriber or by a control signal supplied with the received communication signal. Included within processing units 32a and 32b are low-noise amplifiers 34a and 34b, respectively, and mixing circuitry. Since the mixing circuitry of each processing unit 32a and 32b is substantially identical, the mixing circuitry of processing unit 32a only will be described. The mixing circuitry of processing unit 32a includes a voltage controlled oscillator (VCO) 36a for generating an oscillator signal, a quadrature generator 38a for separating the oscillator signal into in-phase (I) and quadrature (Q) components (i.e., signals separated by 90° in phase), and mixers 40a and 41a for mixing the I signal and Q signal, respectively, with the amplified signal output by amplifier 34a. The mixing circuitry of processing unit 32b similarly outputs I and Q signals in the same frequency band. The quadrature generators 38a and 38b generate quadrature signals which drive the mixers.

In accordance with the direct conversion principle, the frequencies of the signals output by mixers 40a,b and 41a,b are within the same frequency range as the bandwidth of the received signals. Thus, oscillators 36a and 36b are in the same frequency range as the received signals, although the first and second bands can have different bandwidths. As a result of the direct conversion principle, many hardware components of the receiver can be re-used, since there is no conversion of signals to an intermediate frequency outside of the frequency range of the bandwidth of the received signals. In the embodiment of FIG. 2, the low pass filters 42a and 42b are re-used.

The in-phase (I) signals and quadrature (Q) signals output by the selected processing unit are provided to an in-phase low pass filter 42a and a quadrature low pass filter 42b, respectively. These low pass filters 42a and 42b preferably have programmable bandwidths to enable the receiver to accommodate two bands having different bandwidths. The filtered I and Q signals are then passed to baseband processing circuitry 44, which can be conventional baseband processing circuitry as is well-known in the art. It will be appreciated that since direct conversion avoids the use of intermediate frequencies outside of the range of the received signals, the signals output by processing units 32a and 32b can be filtered in low pass filters rather than band pass filters. In contrast, because a superheterodyne receiver uses intermediate frequencies outside of the range of the received signals, band pass filters are necessary. This difference provides a significant advantage, since low pass filters can be implemented more easily than band pass filters, and programmable low pass filters are more easily implemented than programmable band pass filters. Because the channel selection filtering can be performed with programmable low pass filters, it is possible to implement a dual band receiver with the two bands having different bandwidths. A low pass filter can be designed relatively easily with a programmable bandwidth if it is integrated either as an analog or as a digital filter. In contrast, bandpass filters are typically discrete filters which cannot be programmed for different bandwidths. Further, the relatively simple architecture of the direct-conversion receiver of FIG. 2 simplifies the frequency planning of the wireless communication device. It should be appreciated that while a two-band receiver is shown, the principles of the invention can be applied to design a receiver having three or more bands.

Figure 3:
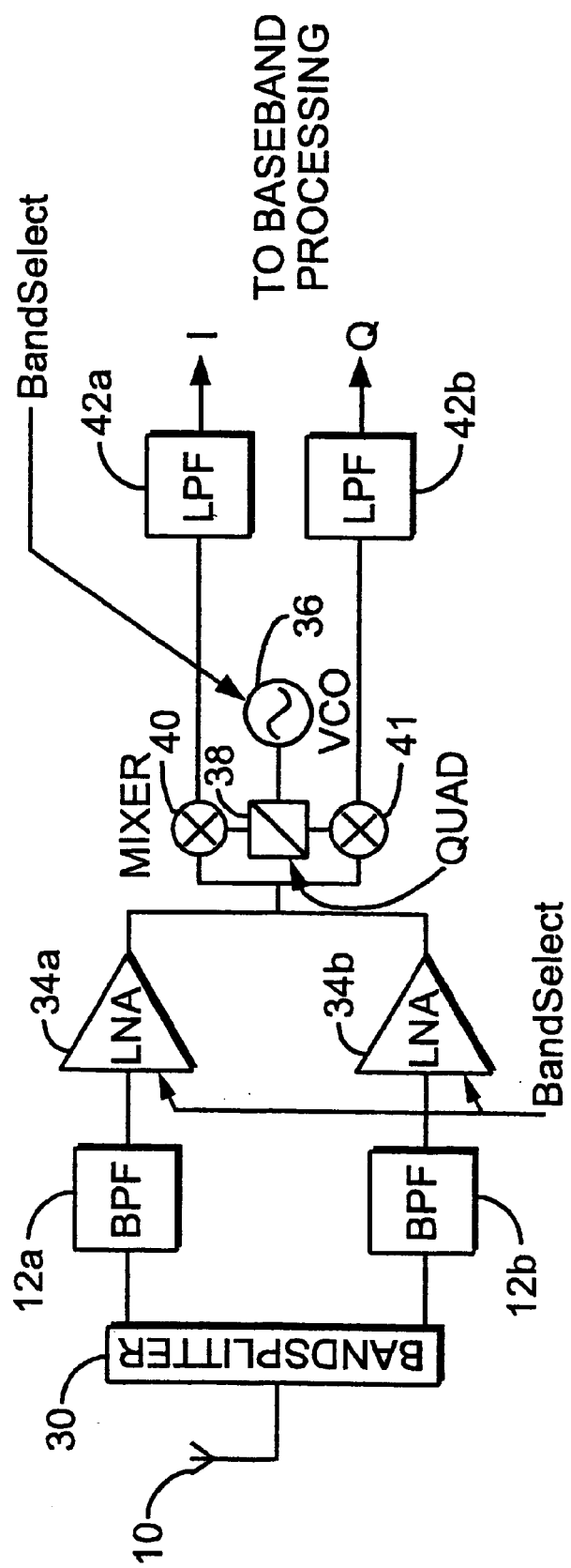
FIG. 3 is a block diagram of a direct-conversion receiver according to a second preferred embodiment of the present invention.

FIG. 3 shows a block diagram of a second embodiment of the present invention. In this embodiment, a single mixing circuit, with a single voltage controlled oscillator (VCO) 36 and mixers 40 and 41, is used to mix the amplified signals generated in each frequency band. The mixing circuitry generates in-phase (I) and quadrature (Q) signals which are filtered in low pass filters 42a and 42b. In this embodiment, the VCO 36 should have a relatively large bandwidth, sufficient to include all of the frequency bands which the receiver is capable of receiving. Alternatively, the VCO 36 can be switchable between multiple oscillation frequencies. Also, the quadrature generator 38 can be replaced by a frequency divider which generates quadrature local oscillator (LO) signals from the oscillation signal generated by VCO 36. By dividing a signal's frequency by two, it is possible to generate two quadrature signals. A differential signal at a frequency 2f is divided by two, and the rising edge of each signal controls the edge at the divided signal. Since one half wavelength at 2f is equal to one quarter of a wavelength at frequency f, the resulting signals are quadrature signals. If a frequency divider is used, the VCO 36 must operate at an appropriate multiple of the desired LO frequency; for example, for a quadrature generator operating at one or two frequencies, the frequency divider divides by 2 or 2 and 4, respectively. This approach can require a better semiconductor process with a higher $f_T$ or a higher current consumption; however, this approach is a robust wideband implementation and can reduce spurious emissions. While this embodiment shows the use of a single quadrature generator and a single VCO, it should be appreciated that multiple VCO's (with appropriate switching means) can be used with a single quadrature generator, or multiple VCO's can be used with multiple quadrature generators, or a single VCO can be used with multiple quadrature generators.

Figure 4:
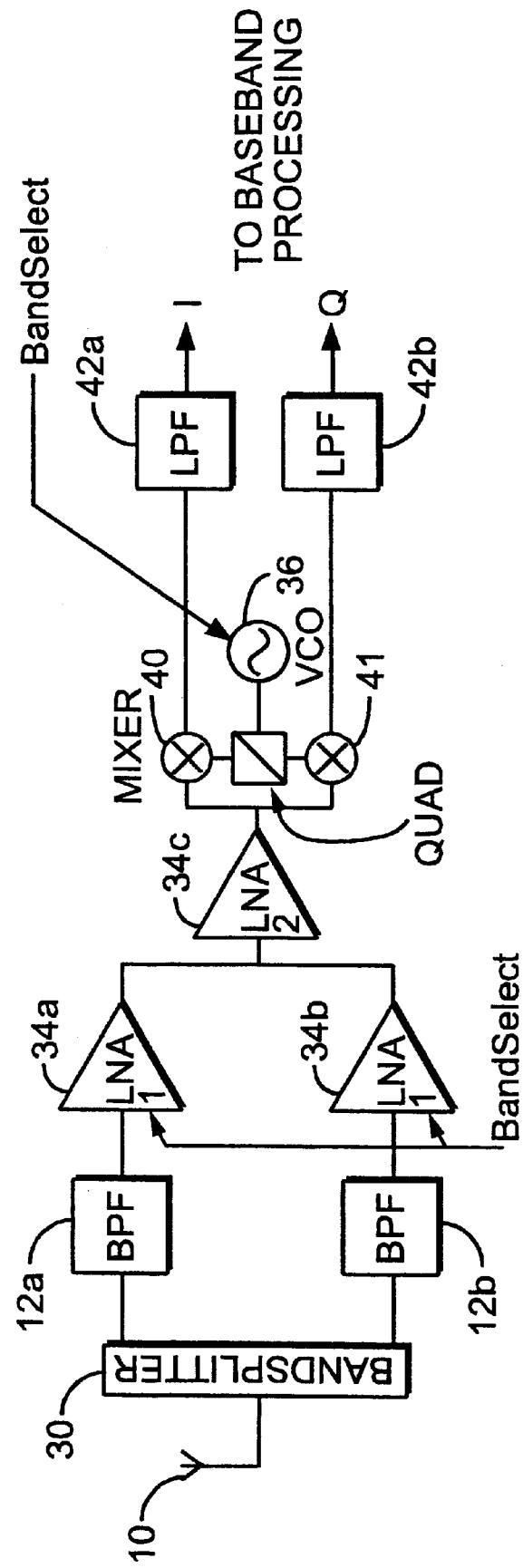
FIG. 4 is a block diagram of a direct-conversion receiver according to a third preferred embodiment of the present invention.

FIG. 4 shows a block diagram of a third embodiment of the present invention. This embodiment is substantially similar to the embodiment of FIG. 3, except that the amplifier means is divided. In particular, the low noise amplifiers 34a and 34b are bandspecific, and a low noise amplifier 34c is provided which is generic for two or more bands, or which includes a portion of a low noise amplifier such that a combination of, for example, 34a and 34c form a complete low raise amplifier (in other words, a portion of a low noise amplifier can be common to multiple bands). Splitting the low noise amplifier means into band-specific and generic components allows the first portion of the low noise amplifier means (amplifiers 34a and 34b) to provide a band select function, and reduces the overall circuit complexity by re-using a portion of the low-noise amplifier circuitry. If the multiple-band receiver is to receive GSM and DCS signals, it is preferable to use bandspecific LNAs for each band because current consumption will be less in the GSM LNA compared to the DCS LNA; therefore, the current consumption of the receiver can be reduced by using a split amplifier.

Figure 5:
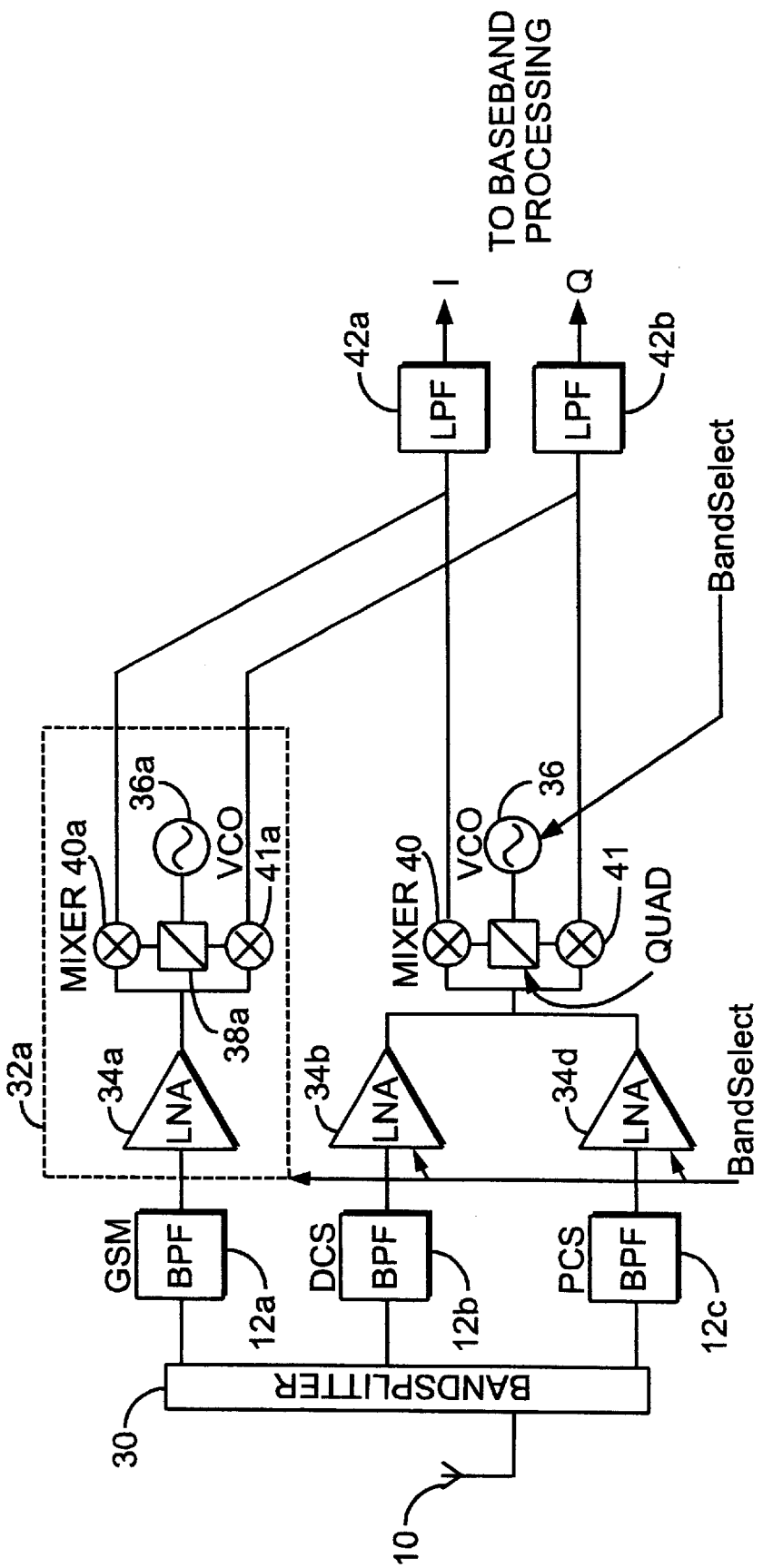
FIG. 5 is a block diagram of a direct-conversion receiver according to a fourth preferred embodiment of the present invention.

FIG. 5 shows a block diagram of a fourth embodiment of the present invention. The embodiment of FIG. 5 shows a three band receiver for receiving signals on three bands (e.g., GSM, DCS, and PCS). This embodiment combines the features of the embodiments of FIG. 2 and FIG. 3; it will be appreciated that other combinations can be designed. In this embodiment, the bandsplitter 30 splits the received signal into three bands, and band pass filters 12a, 12b, and 12c filter the split signals as appropriate for the three bands (in this example, GSM, DCS, and PCS, respectively). The GSM signal branch includes a processing unit 32a which is substantially identical to the similarly-designated unit in FIG. 2. Processing unit 32a outputs in-phase (I) and quadrature (Q) signals to in-phase and quadrature low pass filters 42a and 42b, respectively. The DCS and PCS branches of this circuit include separate low-noise amplifiers 34b and 34d, and a single mixing circuitry unit that includes a tunable, programmable, or switchable high bandwidth VCO 36 as described above with respect to FIG. 4. The common mixing circuitry unit generates in-phase and quadrature signals and provides these signals to the in-phase and quadrature low pass filters 42a and 42b, respectively.

It will be appreciated that many circuit combinations other than those described above can be designed in accordance with the principles of the present invention. For example, the embodiment of FIG. 5 could easily be modified to include band-specific and common low-noise amplifiers for the branches sharing a single mixing circuit and VCO. By providing for a relatively low number of frequency conversion operations, each of which results in a frequency within the frequency range of the bandwidth of the received signals (i.e., direct conversion), significant signal processing advantages can be achieved. In particular, a multiple-mode communication receiver can be greatly simplified with components such as LNAs, quadrature generators, mixers, VCOs and low pass filters re-used. Further, as a result of using the direct conversion principle, low pass filters can be used in place of the band pass filters typically required for superheterodyne circuitry. Because programmable low pass filters are more easily implemented than band pass filters, the receiver circuitry can be further simplified.

While the foregoing description includes numerous details and specificities, it is to be understood that these are for purposes of explanation only. Many modifications will be readily apparent to those of ordinary skill in the art which are clearly within the spirit and scope of the invention, as defined by the following claims and their legal equivalents.

What is claimed is:

1. A multiple-band communication receiver, comprising:
   receiving means for receiving communication signals in any one of a plurality of frequency bands, the received communication signals having a bandwidth;
   amplifier means for selectively amplifying the received communication signals in one of the plurality of frequency bands, wherein the amplifier means includes at least one band-specific amplifier for each of the plurality of frequency bands;
   quadrature generation means for generating in-phase and quadrature signals from the amplified signals;
   low pass filtering means for filtering the in-phase and quadrature signals; and
   baseband processing means for processing the filtered in-phase and quadrature signals,
   wherein the multiple-band communication receiver uses direct conversion for converting all of the received communication signals in any one of the plurality of frequency bands.

2. The receiver of claim 1, further comprising band pass filtering means for filtering communication signals in each of the plurality of frequency bands.

3. The receiver of claim 1, wherein the quadrature generation means includes mixing means for mixing the amplified signals with in-phase and quadrature oscillator signals, the in-phase and quadrature oscillator signals being of a frequency within the bandwidth of the received communication signals.

4. The receiver of claim 1, wherein the low pass filtering means includes a low pass filter having a programmable bandwidth.

5. The receiver of claim 1, wherein the quadrature generation means includes a single voltage controlled oscillator.

6. The receiver of claim 1, wherein the quadrature generation means includes multiple voltage controlled oscillators.

7. The receiver of claim 1, wherein the amplifier means further includes at least one common amplifier for amplifying signals output by the frequency-specific low noise amplifiers.

8. The receiver of claim 1, wherein the quadrature generation means includes a quadrature generator shared between two or more of the plurality of frequency bands.

9. The receiver of claim 1, wherein the quadrature generation means includes multiple quadrature generators.

10. The receiver of claim 1, wherein the quadrature generation means includes at least one oscillator having a selectable oscillation frequency.

11. The receiver of claim 1, wherein the quadrature generation means includes at least one oscillator and a frequency dividing means for dividing an oscillator signal generated by one of the at least one oscillator.

12. The receiver of claim 1, wherein the plurality of frequency bands each has a different bandwidth.

13. A method for receiving a communication signal, comprising the steps of:
   receiving a communication signal in any one of a plurality of frequency bands, the communication signal having a bandwidth;
   band-pass filtering the received communication signal;
   amplifying the band-pass filtered signal;
   mixing the band-pass filtered signal with in-phase and quadrature oscillator signals to generate an in-phase and a quadrature received signal; and
   low pass filtering the in-phase received signal and the quadrature received signal in a low pass in-phase filter and a low pass quadrature filter, respectively,
   wherein direct conversion is used for converting all received communication signals in any one of the plurality of frequency bands.

14. The method of claim 13, wherein the in-phase received signal and the quadrature received signal are within the bandwidth of the communication signal.

15. The method of claim 13, wherein the low pass in-phase filter and the low pass quadrature filter have programmable bandwidths which can be changed to accommodate communication signals of different bandwidths.

16. The method of claim 13, further comprising the step of generating the in-phase and quadrature oscillator signals from an oscillator having a variable oscillation frequency prior to the step of mixing.

17. The method of claim 13, wherein the step of amplifying is performed by first amplifying the band-pass filtered signal in a frequency-specific low noise amplifier, and then amplifying the first amplified signal in a generic low noise amplifier capable of amplifying signals having different frequency ranges.

18. The method of claim 13, further comprising the steps of generating a first oscillator signal and frequency-dividing the first oscillator signal to generate the in-phase and quadrature oscillator signals prior to the step of mixing.

* * * * *